United States Patent
Okamoto

(10) Patent No.: US 12,014,681 B2
(45) Date of Patent: Jun. 18, 2024

(54) INFORMATION TERMINAL

(71) Applicant: Semiconductor Energy Laboratory Co., Ltd., Kanagawa-ken (JP)

(72) Inventor: Yuki Okamoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 17/186,268

(22) Filed: Feb. 26, 2021

(65) Prior Publication Data

US 2021/0280152 A1     Sep. 9, 2021

Related U.S. Application Data

(63) Continuation of application No. 15/656,725, filed on Jul. 21, 2017, now Pat. No. 10,937,387.

(30) Foreign Application Priority Data

Jul. 28, 2016  (JP) ................................. 2016-148050

(51) Int. Cl.
*G09G 3/3233* (2016.01)
*G02F 1/1335* (2006.01)
(Continued)

(52) U.S. Cl.
CPC ..... *G09G 3/3233* (2013.01); *G02F 1/133553* (2013.01); *G02F 1/1368* (2013.01);
(Continued)

(58) Field of Classification Search
CPC .... G09G 3/3233; G09G 3/035; G09G 3/3648; G09G 5/10; G09G 3/3666; G09G 3/3696;
(Continued)

(56) References Cited

U.S. PATENT DOCUMENTS 6,528,951 B2     3/2003  Yamazaki et al.
6,714,268 B2     3/2004  Wang et al.
(Continued)

FOREIGN PATENT DOCUMENTS

EP    2 320 411 A1      5/2011
JP    2001-066593 A     3/2001
(Continued)

OTHER PUBLICATIONS

Shieh, H., "Transflective Display by Hybrid OLED and LCD," LEOS 2005 (IEEE Lasers and Electro-Optics Society Annual Meeting), Oct. 22, 2005, pp. 650-651, IEEE.
(Continued)

*Primary Examiner* — Patrick N Edouard
*Assistant Examiner* — Eboni N Giles
(74) *Attorney, Agent, or Firm* — Husch Blackwell LLP

(57) ABSTRACT

An information terminal capable of automatically adjusting the brightness of a display portion in accordance with bending of the display portion is provided. The information terminal includes a display portion that includes a first pixel, a second pixel, and a sensor element. The first pixel includes a liquid crystal element. The second pixel includes a light-emitting element. The sensor element includes a first bend sensor whose resistance is changed in accordance with bending of the display portion in a convex direction and a second bend sensor whose resistance is changed in accordance with bending of the display portion in a concave direction. The luminance of the light-emitting element is controlled in accordance with an output of the sensor element.

13 Claims, 11 Drawing Sheets

(51) Int. Cl.
| | |
|---|---|
| *G02F 1/1368* | (2006.01) |
| *G09G 3/00* | (2006.01) |
| *G09G 3/36* | (2006.01) |
| *G09G 5/10* | (2006.01) |
| *H10K 59/00* | (2023.01) |
| *H10K 59/128* | (2023.01) |
| *H10K 59/50* | (2023.01) |
| *H10K 77/10* | (2023.01) |
| *G02F 1/1333* | (2006.01) |
| *G02F 1/1362* | (2006.01) |
| *H01L 27/12* | (2006.01) |
| *H01L 29/786* | (2006.01) |
| *H10K 59/121* | (2023.01) |
| *H10K 59/124* | (2023.01) |
| *H10K 59/38* | (2023.01) |
| *H10K 102/00* | (2023.01) |

(52) U.S. Cl.
CPC .......... *G09G 3/035* (2020.08); *G09G 3/3648* (2013.01); *G09G 5/10* (2013.01); *H10K 59/00* (2023.02); *H10K 59/128* (2023.02); *H10K 59/50* (2023.02); *H10K 77/111* (2023.02); *G02F 1/133305* (2013.01); *G02F 1/133512* (2013.01); *G02F 1/133514* (2013.01); *G02F 1/133565* (2021.01); *G02F 1/136227* (2013.01); *G02F 1/13685* (2021.01); *G02F 2201/44* (2013.01); *G09G 3/3666* (2013.01); *G09G 3/3696* (2013.01); *G09G 2300/023* (2013.01); *G09G 2320/0233* (2013.01); *G09G 2320/045* (2013.01); *G09G 2330/12* (2013.01); *G09G 2380/02* (2013.01); *H01L 27/1225* (2013.01); *H01L 29/7869* (2013.01); *H10K 59/1213* (2023.02); *H10K 59/124* (2023.02); *H10K 59/38* (2023.02); *H10K 2102/311* (2023.02)

(58) Field of Classification Search
CPC ..... G09G 2300/023; G09G 2320/0233; G09G 2320/045; G09G 2330/12; G09G 2380/02; G02F 1/133553; G02F 1/1368; G02F 1/133565; G02F 1/13685; G02F 1/133305; G02F 1/133512; G02F 1/133514; G02F 1/136227; G02F 2201/44; H01L 27/3225; H01L 27/3232; H01L 27/3267; H01L 51/0097; H01L 27/1225; H01L 27/322; H01L 27/3262; H01L 29/7869; H01L 2251/5338; H01L 27/3258

See application file for complete search history.

(56) References Cited

U.S. PATENT DOCUMENTS

| | | | |
|---|---|---|---|
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2* | 7/2007 | Fujii | G09G 3/3648 345/82 |
| 7,385,654 B2 | 6/2008 | Mitsui et al. | |
| 8,854,286 B2 | 10/2014 | Yamazaki et al. | |
| 8,890,781 B2 | 11/2014 | Yamazaki et al. | |
| 9,001,010 B2 | 4/2015 | Jeon | |
| 9,165,502 B2 | 10/2015 | Yamazaki et al. | |
| 9,368,082 B2 | 6/2016 | Yamazaki et al. | |
| 9,710,013 B2 | 7/2017 | Hirakata et al. | |
| 10,585,456 B2* | 3/2020 | Sohn | G06F 1/1684 |
| 10,629,117 B2* | 4/2020 | Sun | H10K 59/1216 |
| 2003/0201960 A1 | 10/2003 | Fujieda | |
| 2006/0072047 A1 | 4/2006 | Sekiguchi | |
| 2008/0180618 A1 | 7/2008 | Fujieda | |
| 2010/0171905 A1 | 7/2010 | Huang et al. | |
| 2011/0102390 A1 | 5/2011 | Moriwaki | |
| 2011/0205209 A1* | 8/2011 | Kurokawa | G01J 1/18 250/338.4 |
| 2013/0207946 A1 | 8/2013 | Kim et al. | |
| 2014/0098075 A1 | 4/2014 | Kwak et al. | |
| 2014/0306985 A1 | 10/2014 | Jeong et al. | |
| 2015/0091016 A1* | 4/2015 | Chen | G02F 1/13338 257/72 |
| 2015/0187276 A1* | 7/2015 | Shim | G09G 3/3291 345/77 |
| 2015/0301636 A1* | 10/2015 | Akimoto | G09G 3/3648 345/173 |
| 2015/0301672 A1* | 10/2015 | Kim | G09G 3/035 345/156 |
| 2015/0316958 A1* | 11/2015 | Takesue | G06F 3/0412 345/173 |
| 2016/0035275 A1 | 2/2016 | Yamazaki et al. | |
| 2016/0232868 A1 | 8/2016 | Yamazaki et al. | |
| 2017/0004788 A1 | 1/2017 | Yamazaki et al. | |
| 2017/0060283 A1 | 3/2017 | Sohn et al. | |
| 2017/0365224 A1 | 12/2017 | Okamoto | |
| 2017/0371489 A1 | 12/2017 | Hong et al. | |
| 2018/0005592 A1 | 1/2018 | Okamoto | |

FOREIGN PATENT DOCUMENTS

| | | |
|---|---|---|
| JP | 2002-196702 A | 7/2002 |
| JP | 2002-328630 A | 11/2002 |
| JP | 2003-029240 A | 1/2003 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2011-099923 A | 5/2011 |
| JP | 2011-099982 A | 5/2011 |
| JP | 2011-141522 A | 7/2011 |
| JP | 2011-141524 A | 7/2011 |
| JP | 2013-221965 A | 10/2013 |
| JP | 2016-038490 A | 3/2016 |
| JP | 2016-038585 A | 3/2016 |
| WO | WO 2004/053819 A1 | 6/2004 |

OTHER PUBLICATIONS

Lee, J. et al., "High Ambient-Contrast-Ratio Display Using Tandem Reflective Liquid Crystal Display and Organic Light-Emitting Device," Optics Express, Nov. 14, 2005, vol. 13, No. 23, pp. 9431-9438.

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

* cited by examiner

10

10

10

INFORMATION TERMINAL

This application is a continuation of copending U.S. application Ser. No. 15/656,725, filed on Jul. 21, 2017 which is incorporated herein by reference.

BACKGROUND OF THE INVENTION

1. Field of the Invention

One embodiment of the present invention relates to an information terminal.

One embodiment of the present invention relates to a semiconductor device. In this specification and the like, a semiconductor device generally means a device that can function by utilizing semiconductor characteristics. In some cases, a display device, a light-emitting device, a memory device, an electrooptic device, a semiconductor circuit, or an electronic device includes a semiconductor device.

Note that one embodiment of the present invention is not limited to the above technical fields. The technical fields of the invention disclosed in this specification and the like relate to an object, a method, or a manufacturing method. Furthermore, one embodiment of the present invention relates to a process, a machine, manufacture, or a composition of matter.

2. Description of the Related Art

A display device in which a reflection type element and a light emission type element are combined has been proposed in Patent Document 1. The reflection type element is used in bright environments and the light emission type element is used in dark environments, so that it is possible to achieve high display quality independent of external light environments and to provide a low-power display device.

A technique for using an oxide semiconductor transistor (hereinafter referred to as an OS transistor) for a display device such as a liquid crystal display or an organic electroluminescence (EL) display has attracted attention.

An OS transistor has extremely low off-state current. With the use of such an extremely low off-state current, refresh frequency at the time of displaying still images is reduced, which results in a reduction in power consumption of liquid crystal displays or organic EL displays. Such a technique has been disclosed in Patent Document 2 and Patent Document 3. Note that the technique for reducing the power consumption of the display device is referred to as idling stop in this specification.

REFERENCES

Patent Document 1: Japanese Published Patent Application No. 2003-157026
Patent Document 2: Japanese Published Patent Application No. 2011-141522
Patent Document 3: Japanese Published Patent Application No. 2011-141524

SUMMARY OF THE INVENTION

An object of one embodiment of the present invention is to provide an information terminal capable of automatically adjusting the brightness of a display portion in accordance with bending of the display portion. Another object of one embodiment of the present invention is to provide a low-power information terminal. Another object of one embodiment of the present invention is to provide a novel information terminal. Another object of one embodiment of the present invention is to provide a novel semiconductor device.

Note that the description of a plurality of objects does not disturb the existence of each object. One embodiment of the present invention does not necessarily achieve all the objects described above. Other objects will be apparent from and can be derived from the description of the specification, the drawings, the claims, and the like, and such objects could be objects of one embodiment of the present invention.

An information terminal in one embodiment of the present invention includes a display portion that includes a first pixel, a second pixel, and a sensor element. The first pixel includes a liquid crystal element. The second pixel includes a light-emitting element. The sensor element includes a first bend sensor whose resistance is changed in accordance with bending of the display portion in a convex direction and a second bend sensor whose resistance is changed in accordance with bending of the display portion in a concave direction. The luminance of the light-emitting element is controlled in accordance with an output of the sensor element.

An information terminal in one embodiment of the present invention includes a display portion that includes a first pixel, a second pixel, and a sensor element. The first pixel includes a liquid crystal element. The second pixel includes a light-emitting element, a transistor supplying current to the light-emitting element, and a capacitor. The sensor element includes a first bend sensor whose resistance is changed in accordance with bending of the display portion in a convex direction and a second bend sensor whose resistance is changed in accordance with bending of the display portion in a concave direction. The sensor element is electrically connected to a gate of the transistor through the capacitor.

An information terminal in one embodiment of the present invention includes a display portion that includes a first pixel, a second pixel, and a sensor element. The first pixel includes a liquid crystal element. The second pixel includes a light-emitting element and a transistor supplying current to the light-emitting element. The sensor element includes a first bend sensor whose resistance is changed in accordance with bending of the display portion in a convex direction and a second bend sensor whose resistance is changed in accordance with bending of the display portion in a concave direction. The sensor element is electrically connected to a back gate of the transistor.

In the information terminal in one embodiment of the present invention, the sensor element may include a first resistor and a second resistor. A first terminal of the first resistor is electrically connected to a first terminal of the first bend sensor. A first terminal of the second resistor is electrically connected to a first terminal of the second bend sensor. A second terminal of the first resistor is electrically connected to a second terminal of the second bend sensor. A second terminal of the second resistor is electrically connected to a second terminal of the first bend sensor. When the display portion is bent in the convex direction, the sensor element outputs the potential of the first terminal of the first bend sensor. When the display portion is bent in the concave direction, the sensor element outputs the potential of the first terminal of the second bend sensor.

In the information terminal in one embodiment of the present invention, the liquid crystal element may be a reflective liquid crystal element.

An information terminal capable of automatically adjusting the brightness of a display portion in accordance with bending of the display portion can be provided. Alternatively, a low-power information terminal can be provided. Alternatively, a novel information terminal can be provided. Alternatively, a novel semiconductor device can be provided.

Note that the description of these effects does not disturb the existence of other effects. One embodiment of the present invention does not necessarily achieve all the effects. Other effects will be apparent from and can be derived from the description of the specification, the drawings, the claims, and the like.

DETAILED DESCRIPTION OF THE INVENTION

Figure 1A:
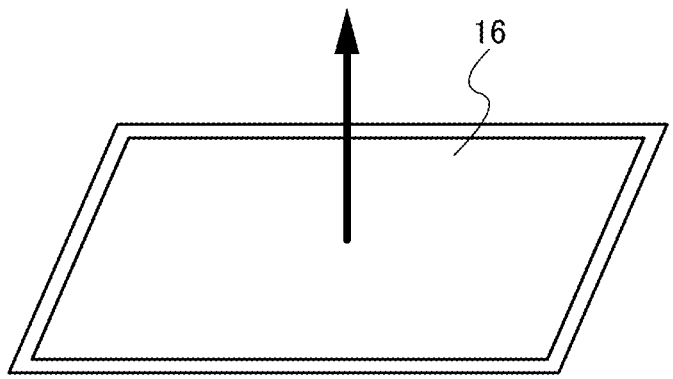
FIGS. 1A to 1C illustrate an information terminal.

Embodiments will be described below with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the following description of the embodiments.

In the drawings, the size, the layer thickness, or the region is exaggerated for clarity in some cases. Thus, embodiments of the present invention are not limited to such scales. The drawings are schematic views showing ideal examples, and embodiments of the present invention are not limited to shapes or values shown in the drawings.

Any of the embodiments described below can be combined as appropriate. In addition, in the case where a plurality of structure examples are described in one embodiment, any of the structure examples can be combined as appropriate.

Embodiment 1

In this embodiment, an information terminal in one embodiment of the present invention is described.

Figure 1B:
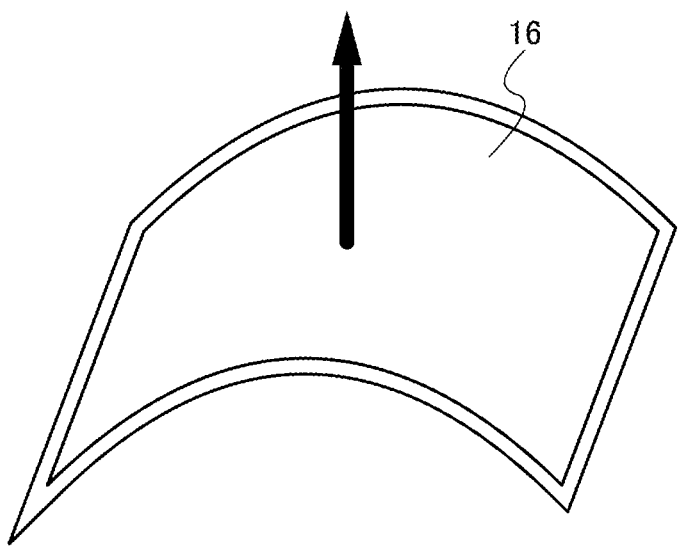
Figure 1C:
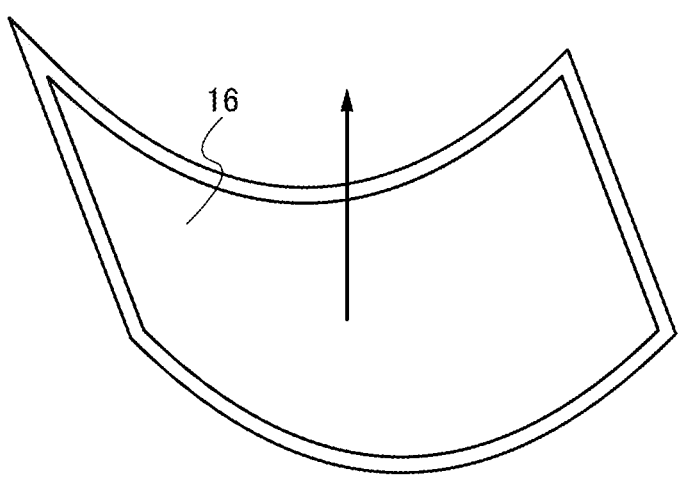

An information terminal 10 in FIG. 1A is flexible. As illustrated in FIG. 1B, a display region 16 can be bent in a convex direction. As illustrated in FIG. 1C, the display region 16 can be bent in a concave direction.

The information terminal 10 includes a display pixel that includes a liquid crystal element and a light-emitting element in the display region 16. The liquid crystal element preferably includes an electrode having a function of reflecting light. The information terminal 10 displays information such as an image or a character in the display region 16 by controlling the liquid crystal element and the light-emitting element independently.

The information terminal 10 includes a sensor element in the display region 16. The sensor element detects the degree of bending (display distortion) of the display region 16.

The amount of light reflected by the liquid crystal element is not constant and is influenced by the degree of bending of the display region 16. When the display region 16 is bent in the convex direction, the amount of external light received by the display region 16 is increased because the number of points (angles) where external light can be received is increased. The increase in the amount of received light results in the increase in the amount of light reflected by the liquid crystal element. When the display region 16 is bent in the concave direction, the amount of external light received by the display region 16 is decreased because part of external light is blocked. The decrease in the amount of received light results in the decrease in the amount of light reflected by the liquid crystal element.

The information terminal 10 corrects the luminance of the light-emitting element in accordance with the increase or decrease in the amount of light reflected by the liquid crystal element that depends on the degree of bending of the display region 16. In the case where the amount of light reflected by the liquid crystal element is increased when the display region 16 is bent in the convex direction, the information terminal 10 decreases the luminance of the light-emitting element. Power consumption can be reduced by the decrease in the luminance of the light-emitting element. In the case where the amount of light reflected by the liquid crystal element is decreased when the display region 16 is bent in the concave direction, the information terminal 10 increases the luminance of the light-emitting element. When the information terminal 10 increases the luminance of the light-emitting element to compensate for the decrease in the amount of light reflected by the liquid crystal element, display quality can be ensured.

Figure 2:
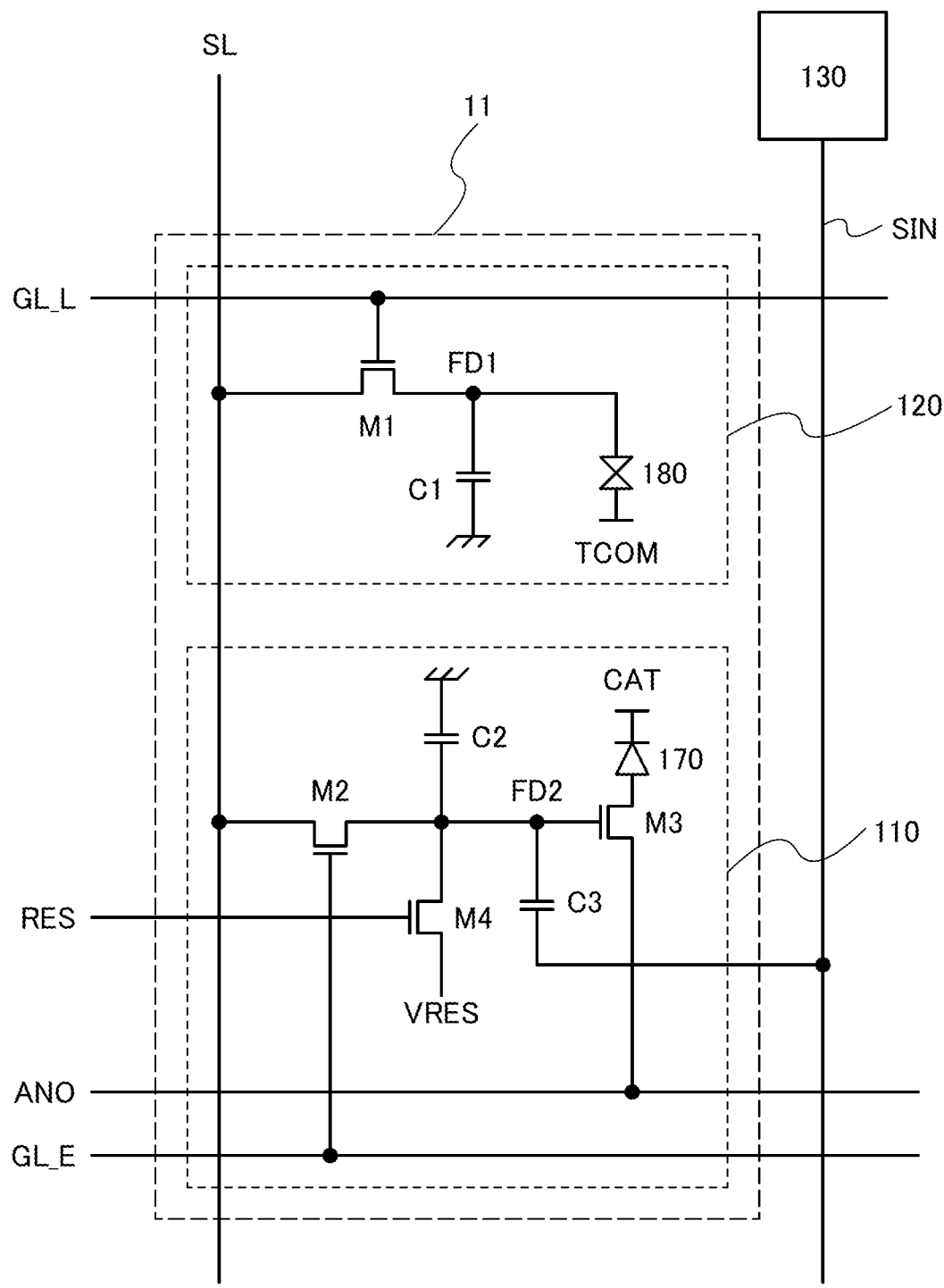
FIG. 2 is a circuit diagram illustrating a display pixel.

A display pixel is described with reference to FIG. 2. One of the features of a display pixel 11 in FIG. 2 is that the display pixel 11 includes a capacitor C3 between a node SIN and a node FD2. Details of the display pixel 11 are described below.

The display pixel 11 includes a pixel 120 and a pixel 110.

The pixel 120 includes a transistor M1, a capacitor C1, and a liquid crystal element 180. The on or off state of the transistor M1 is controlled by a potential applied to a gate line GL_L. When the transistor M1 is turned on, video data for the pixel 120 is written from a source line SL to a node FD1. The capacitor C1 stores charge based on the potential of the node FD1, that is, the video data for the pixel 120. The liquid crystal element 180 controls transmittance in accordance with the potential of the node FD1.

The pixel 110 includes a transistor M2, a transistor M3, a transistor M4, a capacitor C2, the capacitor C3, and a light-emitting element 170. The on or off state of the transistor M4 is controlled by a potential applied to a signal line RES. When the transistor M4 is turned on, the potential of the node FD2 is reset to the potential of a power supply line VRES. The on or off state of the transistor M2 is controlled by a potential applied to a gate line GL_E. When the transistor M2 is turned on, video data for the pixel 110 is written from the source line SL to the node FD2. The capacitor C2 stores charge based on the potential of the node FD2, that is, the video data for the pixel 110. The transistor M3 controls current to be supplied to the light-emitting element 170 in accordance with the potential of the node FD2. The light-emitting element 170 emits light in accordance with current supplied from the transistor M3. In other words, the luminance or emission intensity of the light-emitting element 170 depends on the potential of the node FD2.

A first electrode of the capacitor C3 is connected to the node FD2, and a second electrode of the capacitor C3 is connected to the node SIN. When the potential of the node SIN is changed in accordance with the degree of bending of the display region 16, the potential of the node FD2 is changed by capacitive coupling of the capacitor C3. Then, drain current of the transistor M3 is changed, and the luminance of the light-emitting element 170 is changed.

Each of the transistors M1 to M4 preferably has low current (off-state current) flowing between a source and a drain in an off state. Here, the term "low off-state current" means that normalized off-state current per micrometer of channel width with voltage between a source and a drain set at 1.8 V is lower than or equal to $1 \times 10^{-20}$ A at room temperature, lower than or equal to $1 \times 10^{-18}$ A at 85° C., or lower than or equal to $1 \times 10^{-16}$ A at 125° C. An example of a transistor with such a low off-state current is an OS transistor.

OS transistors are used as the transistors M1 to M4, so that idling stop can be performed in the pixels 120 and 110. As a result, the information terminal 10 with low power consumption can be provided.

Examples of oxide semiconductors that can be used for the OS transistor include an In—Ga oxide, an In—Zn oxide, and an In-M-Zn oxide (M is Ti, Ga, Y, Zr, La, Ce, Nd, Sn, or Hf). The oxide semiconductor is not limited to an oxide containing In. The oxide semiconductor may be, for example, a Zn oxide, a Zn—Sn oxide, or a Ga—Sn oxide.

The OS transistor preferably includes a cloud-aligned composite oxide semiconductor (CAC-OS) in a channel formation region. The OS transistor including a CAC-OS has high on-state current and is highly reliable. Note that details of the CAC-OS will be described later.

Next, a sensor element is described with reference to FIG. 3. In a sensor element 130 in FIG. 3, the potential of the node SIN is increased when the display region 16 is bent in the convex direction, and the potential of the node SIN is decreased when the display region 16 is bent in the concave direction. Details of the sensor element 130 are described below.

Figure 3:
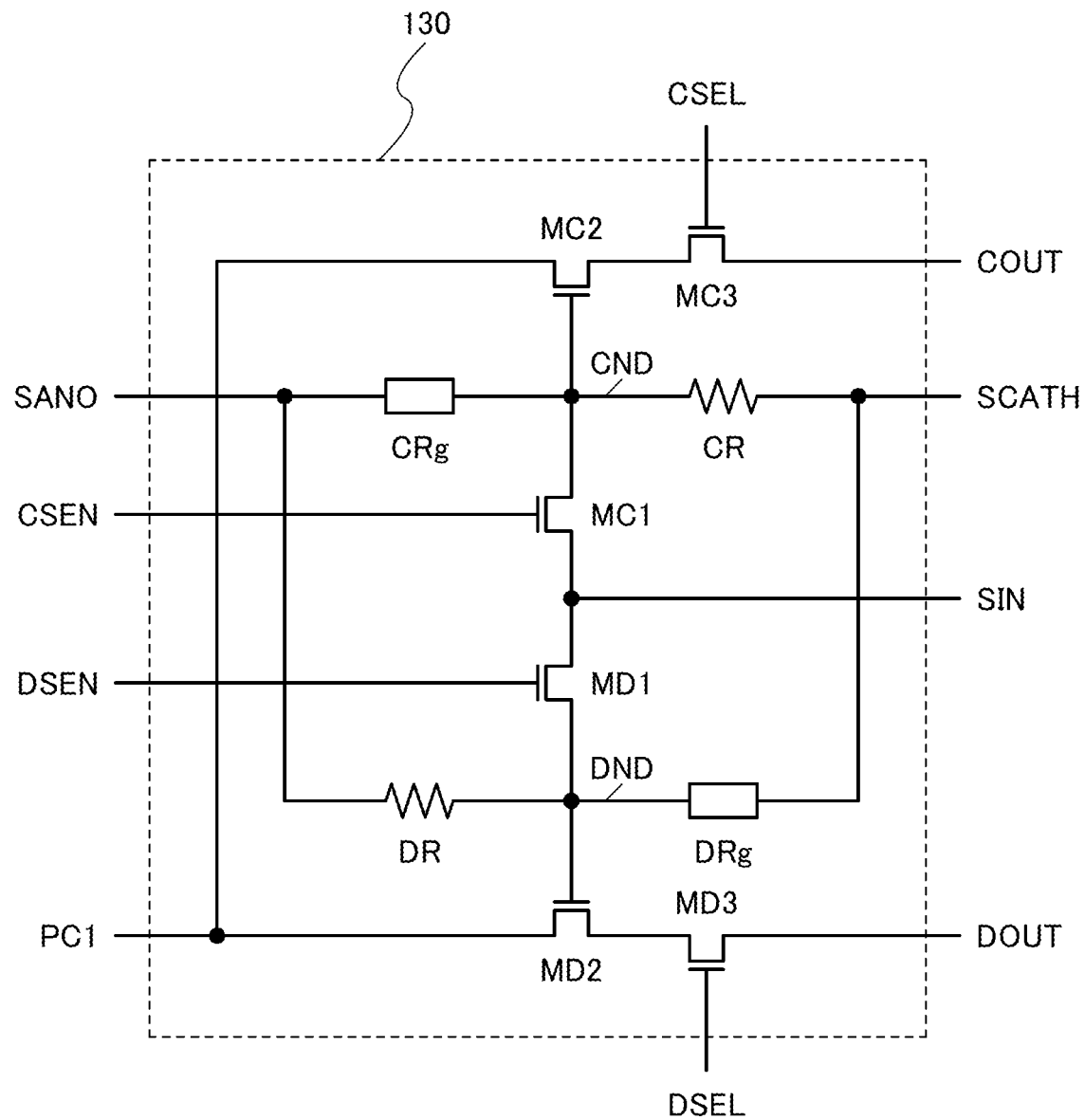
FIG. 3 is a circuit diagram illustrating a sensor element.

The sensor element 130 in FIG. 3 includes a bend sensor CRg, a resistor CR, a bend sensor DRg, a resistor DR, a transistor MC1, a transistor MD1, a transistor MC2, a transistor MD2, a transistor MC3, and a transistor MD3. The on or off state of the transistor MC1 is controlled in accordance with the potential of a signal line CSEN. When the transistor MC1 is turned on, electrical continuity is established between a node CND and the node SIN. The on or off state of the transistor MD1 is controlled in accordance with the potential of a signal line DSEN. When the transistor MD1 is turned on, electrical continuity is established between a node DND and the node SIN. The on or off state of the transistor MC3 is controlled in accordance with the potential of a signal line CSEL. When the transistor MC3 is turned on, an output based on the potential of the node CND is output from COUT. The on or off state of the transistor MD3 is controlled in accordance with the potential of a signal line DSEL. When the transistor MD3 is turned on, an output based on the potential of the node DND is output from DOUT. Signals detected by the sensor element are output from the outputs COUT and DOUT as analog data.

The bend sensor CRg detects distortion (the degree of bending) of the display region 16 in the convex direction, and the bend sensor DRg detects distortion of the display region 16 in the concave direction. The resistance of the bend sensor is increased when the bend sensor is bent in one direction. The resistance of the bend sensor is not changed when the bend sensor is bent in an opposite direction. In the sensor element 130, preferably, the bend sensor CRg is positioned in such a manner that the resistance of the bend sensor CRg is changed when the display region 16 is bent in the convex direction and the bend sensor DRg is positioned in such a manner that the resistance of the bend sensor DRg is changed when the display region 16 is bent in the concave direction. Thus, when the display region 16 is bent in the convex direction, the resistance of the bend sensor CRg is increased and the resistance of the bend sensor DRg is not changed. When the display region 16 is bent in the concave direction, the resistance of the bend sensor CRg is not changed and the resistance of the bend sensor DRg is increased.

Changes in the resistance of the bend sensor CRg and the resistance of the bend sensor DRg influence the potentials of the node CND and the node DND. In the case where the potential of a wiring SANO is higher than the potential of a wiring SCATH and the display region 16 is bent in the convex direction to increase the resistance of the bend sensor CRg, the potential of the node CND is decreased. In the case where the display region 16 is bent in the concave direction to increase the resistance of the bend sensor DRg, the potential of the node DND is increased.

The potential $V_{cnd}$ of the node CND and the potential $V_{dnd}$ of the node DND can be expressed by Formula (1) and Formula (2), respectively. Note that R1C, R1D, R2C, R2D, Va, and Vc (Va>Vc) represent the resistance of the bend sensor CRg, the resistance of the bend sensor DRg, the resistance of the resistor CR, the resistance of the resistor DR, the voltage of the wiring SANO, and the voltage of the wiring SCATH, respectively. According to Formula (1), the potential $V_{cnd}$ of the node CND is decreased when the resistance of the bend sensor CRg is changed in a positive direction, and the potential $V_{cnd}$ of the node CND is increased when the resistance of the bend sensor CRg is changed in a negative direction. According to Formula (2), the potential $V_{dnd}$ of the node DND is increased when the resistance of the bend sensor DRg is changed in a positive direction, and the potential $V_{dnd}$ of the node DND is decreased when the resistance of the bend sensor DRg is changed in a negative direction.

$$V_{cnd} = \frac{R2C}{R1C + R2C} Va + \frac{R1C}{R1C + R2C} Vc \quad (1)$$

$$V_{dnd} = \frac{R1D}{R1D + R2D} Va + \frac{R2D}{R1D + R2D} Vc \quad (2)$$

The sensor element 130 controls the potential of the node SIN by using the potential of the node CND or the potential of the node DND. In the case where the display region 16 is bent in the convex direction, the sensor element 130 outputs the potential of the node CND to the node SIN by turning on the transistor MC1. In the case where the display region 16 is bent in the convex direction and the transistor MC1 is on, the potential of the node SIN is decreased because the potential of the node CND is comparatively low. In the case where the display region 16 is bent in the concave direction, the sensor element 130 outputs the potential of the node DND to the node SIN by turning on the transistor MD1. In the case where the display region 16 is bent in the concave direction and the transistor MD1 is on, the potential of the node SIN is increased because the potential of the node DND is high.

Since the information terminal 10 includes the display pixel 11 (the pixels 120 and 110) and the sensor element 130, the information terminal 10 can correct the brightness of the display region 16 in accordance with the degree of bending of the display region 16. In the case where the display region 16 is bent in the convex direction, the amount of light reflected by the liquid crystal element 180 is increased in the pixel 120. In contrast, in the pixel 110, the potential of the node FD2 is decreased by capacitive coupling of the capacitor C3 when the sensor element 130 decreases the potential of the node SIN. Then, the amount of current supplied to the light-emitting element 170 is decreased, so that the luminance of the light-emitting element 170 is decreased. In the case where the display region 16 is bent in the concave direction, the amount of light reflected by the liquid crystal element 180 is decreased in the pixel 120. In contrast, in the pixel 110, the potential of the node FD2 is increased by capacitive coupling of the capacitor C3 when the sensor element 130 increases the potential of the node SIN. Then, the amount of current supplied to the light-emitting element 170 is increased, so that the luminance of the light-emitting element 170 is increased.

In addition, the information terminal 10 can automatically correct the brightness of the display region 16. The information terminal 10 requires neither rewriting of video data nor operation of a special external circuit or driver to correct the brightness of the display region 16. Therefore, power consumption can be reduced. With the above correction, the information terminal 10 can set the luminance of the light-emitting element 170 in the pixel 110 to optimum luminance when the display region is bent, and power consumption can be reduced without loss of display quality.

Figure 4:
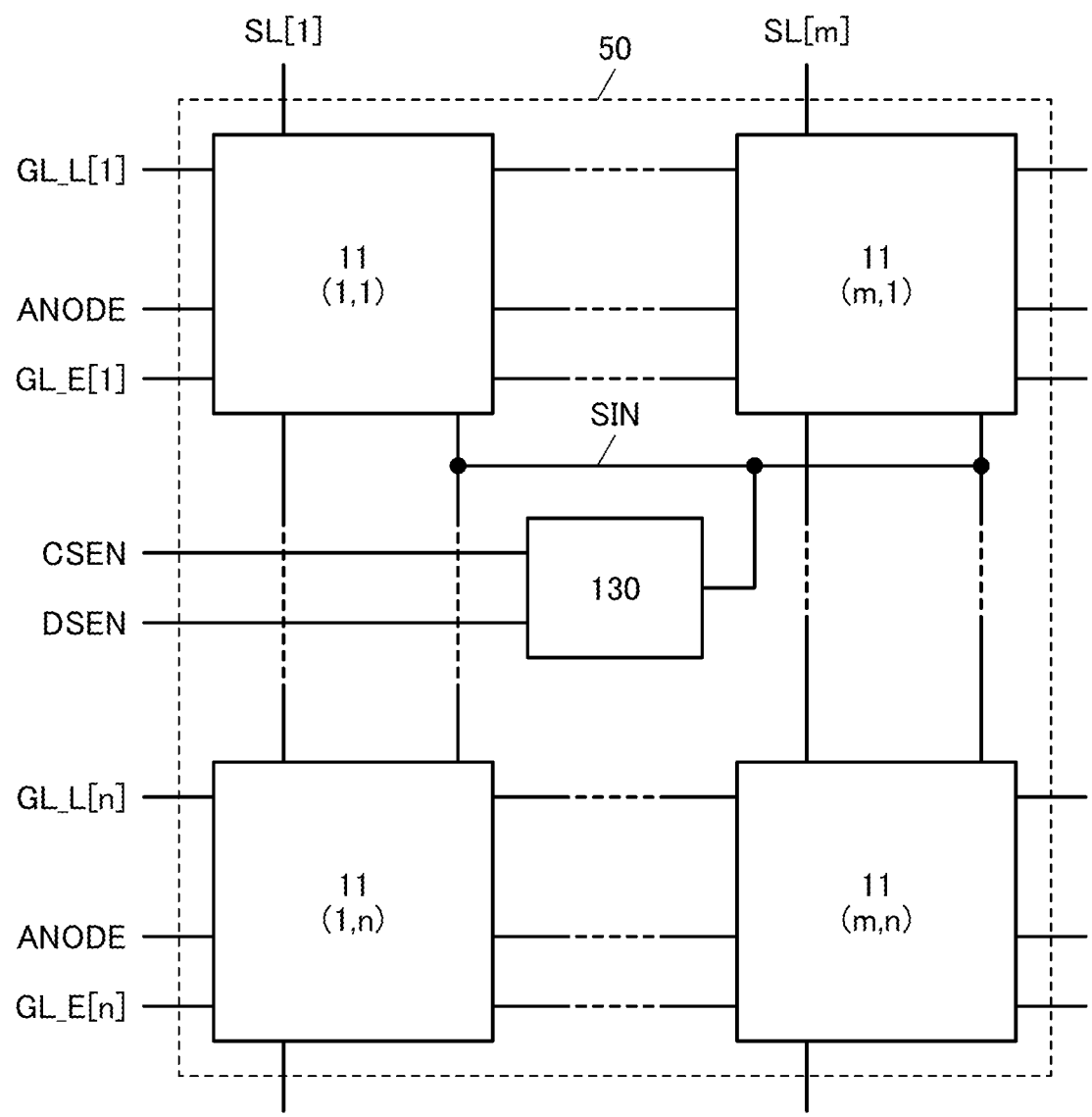
FIG. 4 is a circuit diagram illustrating a pixel block.

The display region 16 includes a plurality of pixel blocks 50. The pixel block 50 in FIG. 4 includes display pixels 11(1,1) to 11(m,n) (each of m and n is a natural number) and the sensor element 130.

The signal line CSEN and the signal line DSEN are preferably global signal lines. Correction can be performed simultaneously in all the pixel blocks 50. Note that the signal line CSEN and the signal line DSEN may be controlled in each pixel block 50 to perform correction in each pixel block. Thus, even when the display region 16 is bent intricately, it is possible to perform optimum correction in each region.

Figure 5:
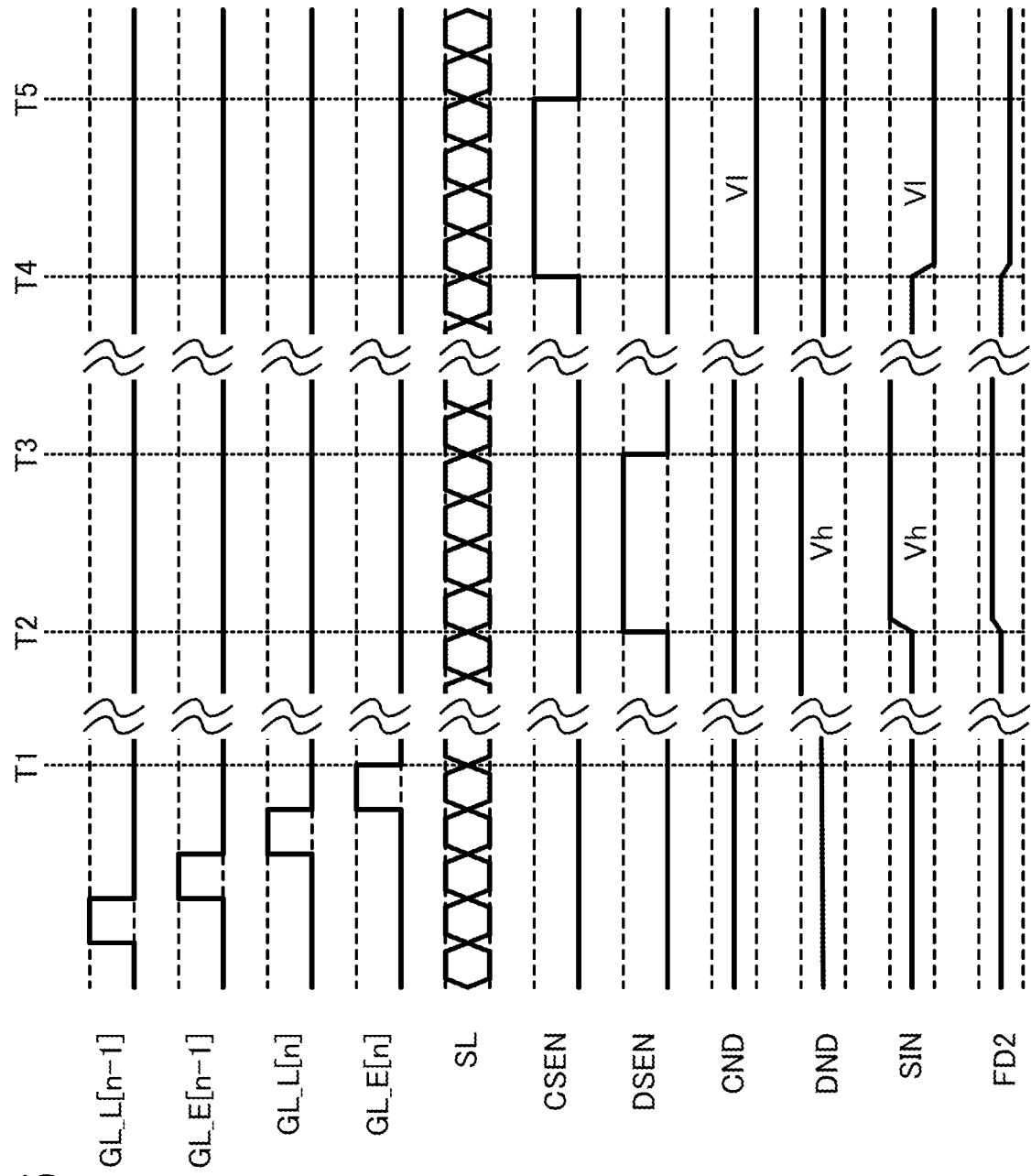
FIG. 5 is a timing chart showing an operation example of a display pixel and a sensor element.

FIG. 5 is a timing chart when the luminance of the light-emitting element 170 is changed by display with the liquid crystal element 180 and an output of the sensor element 130. Note that the information terminal 10 can be used under a precondition of display with the liquid crystal element 180 where the brightness of external light delivered to a panel is higher than or equal to certain brightness and the display with the liquid crystal element 180 can be recognized.

By time T1, a gate line GL_L[1], a gate line GL_E[1], a gate line GL_L[2], gate lines GL_E[2] to GL_L[n], and a gate line GL_E[n] are sequentially selected, so that the video data for the pixel 120 and the video data for the pixel 110 are written to the display pixels 11.

It is assumed that the display region 16 is bent in the concave direction before time T2. In that case, the resistance of the bend sensor DRg is increased, so that the potential of the node DND is increased to Vh. At the time T2, the potential of the signal line DSEN is changed from a low level into a high level and is transmitted to the node SIN through the transistor MD1; thus, the potential of the node SIN is set to Vh. In that case, the potential of the node FD2 is increased by capacitive coupling through the capacitor C3. Thus, the luminance of the light-emitting element 170 is increased. At time T3, the potential of the signal line DSEN is set to a low level, so that the transistor MD1 is turned off. At this time, the potentials of the node SIN and the node FD2 are determined, and the light-emitting element 170 emits light in accordance with the potential of the node FD2.

Next, it is assumed that the display region 16 is bent in the convex direction before time T4. In that case, the resistance of the bend sensor CRg is increased, so that the potential of the node CND is decreased to Vl. At the time T4, the potential of the signal line CSEN is changed from a low level into a high level and is transmitted to the node SIN through the transistor MC1; thus, the potential of the node SIN is set to Vl. In that case, the potential of the node FD2 is decreased by capacitive coupling through the capacitor C3. Thus, the luminance of the light-emitting element 170 is decreased. At time T5, the potential of the signal line CSEN is set to a low level, so that the transistor MC1 is turned off. At this time, the potentials of the node SIN and the node FD2 are determined, and the light-emitting element 170 emits light in accordance with the potential of the node FD2.

A mechanism to detect the degree of bending of a flexible display in the sensor element 130 is described.

Figure 6:
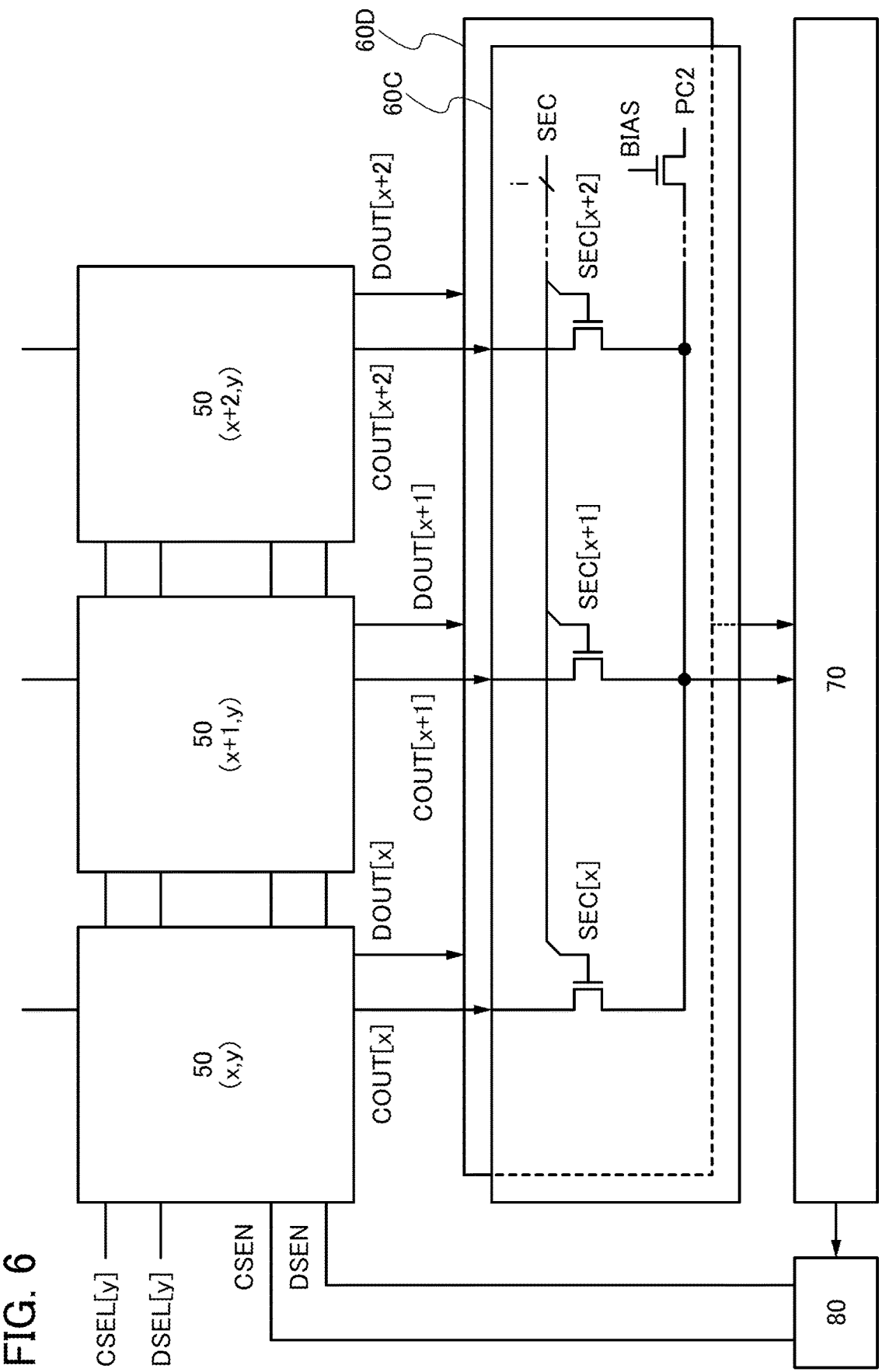
FIG. 6 is a circuit diagram illustrating pixel blocks and peripheral circuits.

FIG. 6 illustrates the entire structure in which the signal line CSEN, the signal line DSEN, the signal line CSEL, the signal line DSEL, the output COUT, and the output DOUT of the sensor element 130 in the pixel blocks 50 are picked out and combined with peripheral circuits of the sensor element 130. As described above, in the case where the transistor MC1 is turned on, the potential of the node SIN is expressed by Formula (1). In addition, in the case where the transistor MD1 is turned on, the potential of the node SIN is expressed by Formula (2).

As illustrated in FIG. 6, an output of a desired column is selected by a multiplexer 60C from the outputs COUT of pixel blocks in a row selected by the signal line CSEL. In addition, an output of a desired column is selected by a multiplexer 60D from the output DOUT of pixel blocks in a row selected by the signal line DSEL. Specifically, a transistor selected by a signal line SEC is turned on, and COUT of a corresponding column is output from the multiplexer 60C. Note that the circuit structure of the multiplexer 60D is similar to that of the multiplexer 60C.

Output signals of the multiplexer 60C and the multiplexer 60D are converted into digital signals by an AD converter 70 and are output to a determination circuit 80. The determination circuit 80 has a function of determining whether distortion occurs in the concave direction or the convex direction. Specifically, the determination circuit 80 analyzes output values from COUT and DOUT to determine the distortion direction of the display. Furthermore, the determination circuit 80 has a function of generating potentials to be supplied to the signal lines CSEN and DSEN on the basis of determination results of distortion of the display. Specifically, an H-level potential is supplied to the signal line DSEN when the determination circuit 80 detects distortion in the concave direction, and an H-level potential is supplied to the signal line CSEN when the determination circuit 80 detects distortion in the convex direction.

Figure 7:
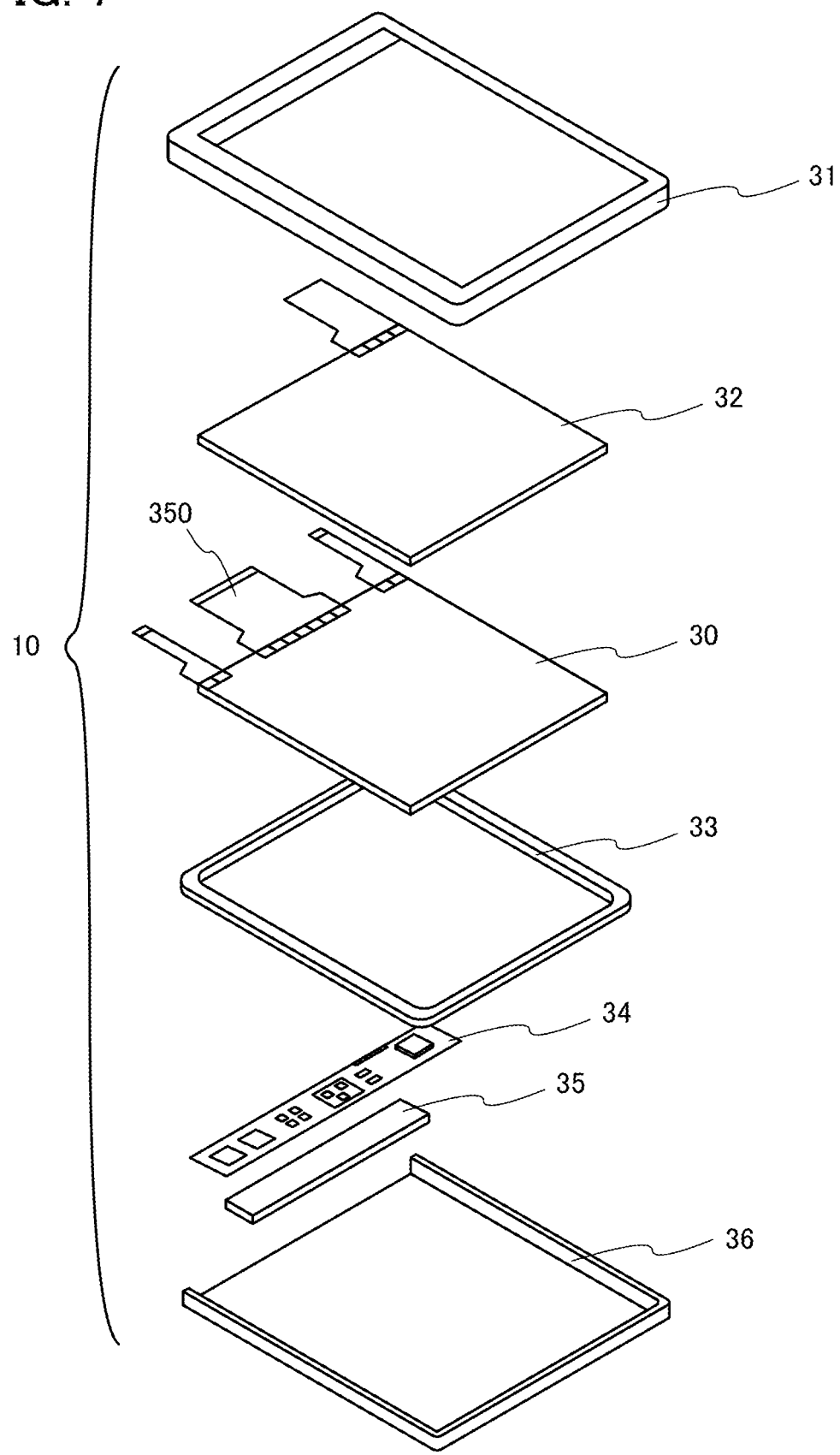
FIG. 7 is a perspective view illustrating an information terminal module.

An example of a module included in the information terminal 10 is described. The information terminal 10 in FIG. 7 includes, between an upper cover 31 and a lower cover 36, a touch panel 32, a display panel 30 connected to an FPC 350, a frame 33, a printed wired board 34, and a battery 35. The shapes and sizes of the upper cover 31 and the lower cover 36 can be changed as appropriate in accordance with the shape and size of the display panel 30. The upper cover 31, the lower cover 36, the display panel 30, and the frame 33 are preferably flexible. When these modules are flexible, the information terminal 10 is also flexible.

Figure 8:
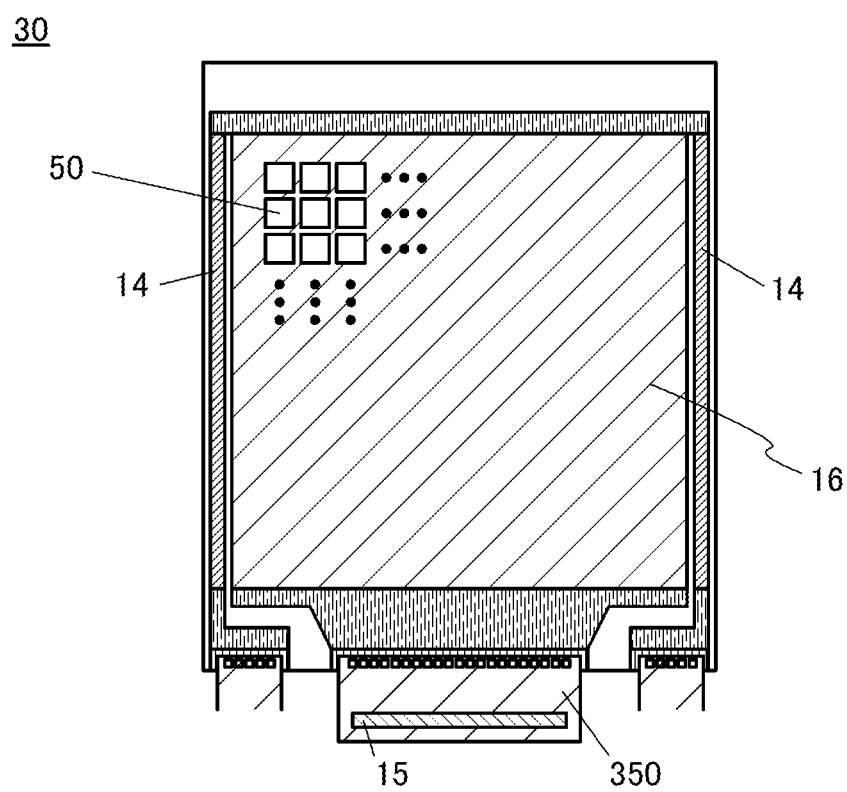
FIG. 8 is a top view illustrating a display panel.

The display panel 30 in FIG. 8 includes the display region 16, the FPC 350, gate drivers 14, and a source driver 15. The display region 16 includes the plurality of pixel blocks 50.

Figure 9:
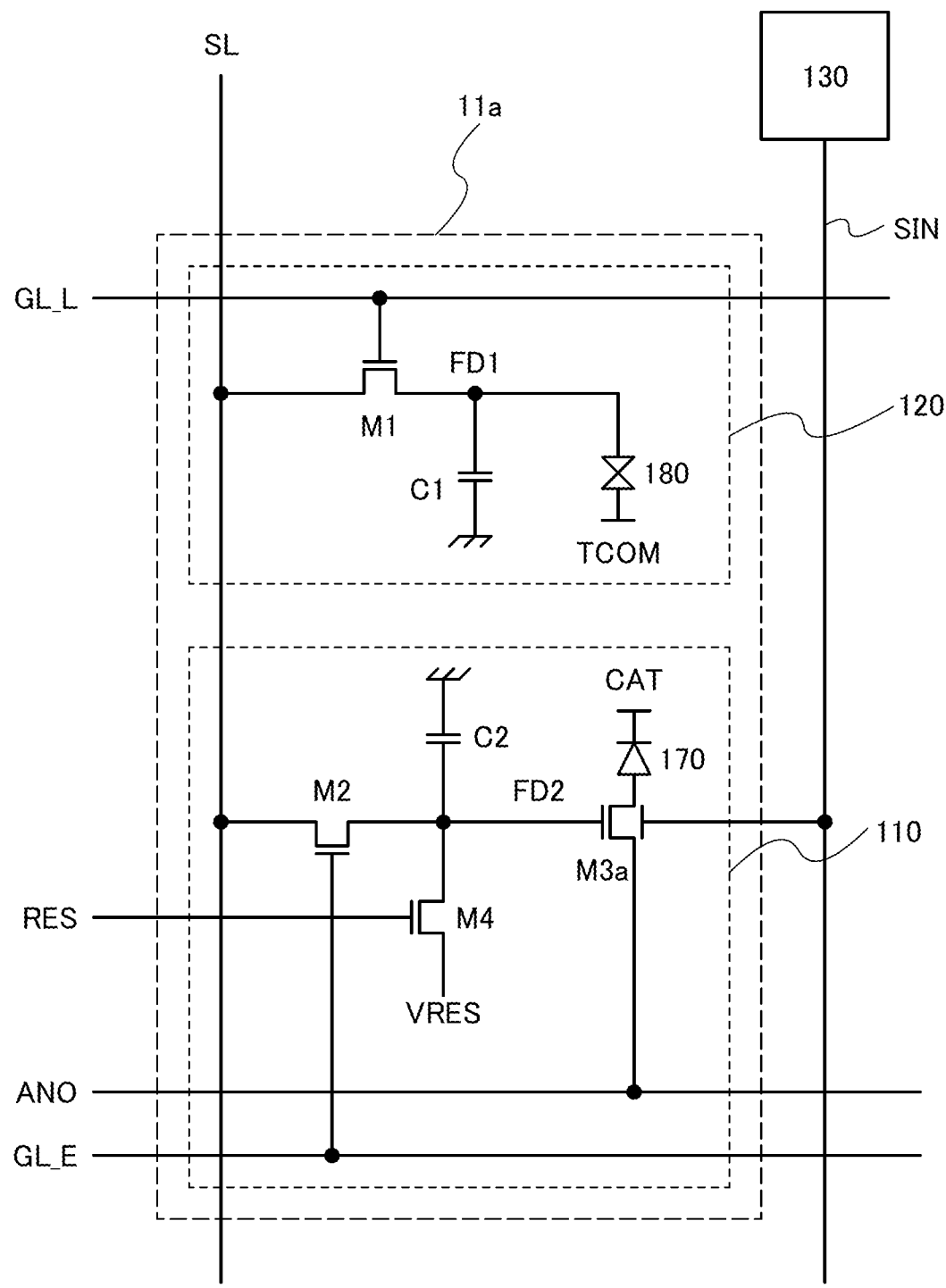
FIG. 9 is a circuit diagram illustrating a display pixel.

A display pixel 11a in FIG. 9 is a modification example of the display pixel 11 in FIG. 2. The display pixel 11a differs from the display pixel 11 in that the capacitor C3 is not included and that a transistor M3a is included instead of the transistor M3. The transistor M3a has a double-gate structure. A first gate of the transistor M3a is connected to the node FD2, and a second gate (back gate) of the transistor M3a is connected to the node SIN.

In the display pixel 11a, the luminance of the light-emitting element 170 is corrected by changing the threshold voltage of the transistor M3a. In the case where the potential of the node SIN is decreased when the display region 16 is bent in the convex direction, the decrease in the potential of the second gate of the transistor M3a results in the increase in the threshold voltage of the transistor M3a. Then, the luminance of the light-emitting element 170 is decreased because the drain current of the transistor M3a is decreased. In the case where the potential of the node SIN is increased when the display region 16 is bent in the concave direction, the increase in the potential of the second gate of the transistor M3a results in the decrease in the threshold voltage of the transistor M3a. Then, the luminance of the light-emitting element 170 is increased because the drain current of the transistor M3a is increased.

At least part of this embodiment can be combined with any of the other embodiments described in this specification as appropriate.

Embodiment 2

In this embodiment, a structure example of the display panel 30 is described with reference to FIG. 10.

Figure 10:
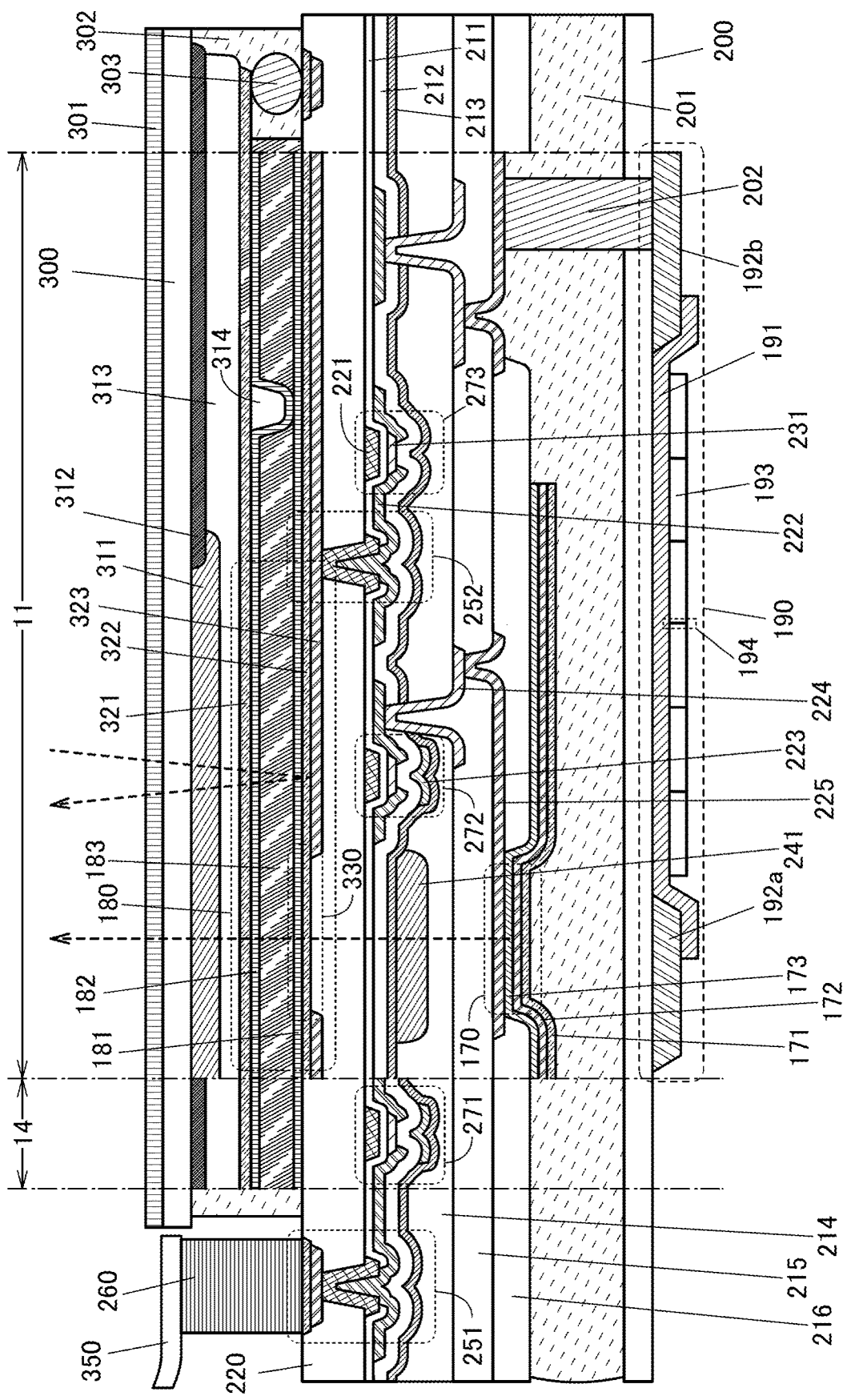
FIG. 10 is a cross-sectional view illustrating a display panel.

FIG. 10 is a cross-sectional view of the display panel 30.

The display panel 30 in FIG. 10 includes an insulating layer 220 between a film 200 and a film 300. The display panel 30 further includes a bend sensor element 190, the light-emitting element 170, a transistor 271, a transistor 272, a transistor 273, a coloring layer 241, and the like between the film 200 and the insulating layer 220. Furthermore, the display panel 30 includes the liquid crystal element 180, a coloring layer 311, and the like between the insulating layer 220 and the film 300. The film 300 and the insulating layer 220 are bonded to each other with an adhesive layer 302. The film 200 and the insulating layer 220 are bonded to each other with an adhesive layer 201.

For example, the bend sensor element 190 corresponds to the bend sensor CRg or the bend sensor DRg. For example, the transistor 273 corresponds to the transistor M1. For example, the transistor 272 corresponds to the transistor M3.

The films 200 and 300 are preferably flexible. For the films 200 and 300, for example, metal, alloy, resin, glass, or fiber thereof can be used. Examples of the resin include polyester, polyolefin, polyamide (e.g., nylon or aramid), polyimide, polycarbonate, acrylic, and polytetrafluoroethylene (PTFE).

The transistor 273 is electrically connected to the liquid crystal element 180, and the transistor 272 is electrically connected to the light-emitting element 170. Since the transistors 272 and 273 are formed on a surface of the insulating layer 220 that is on the film 200 side, the transistors 272 and 273 can be formed through the same process.

Figure 11A:
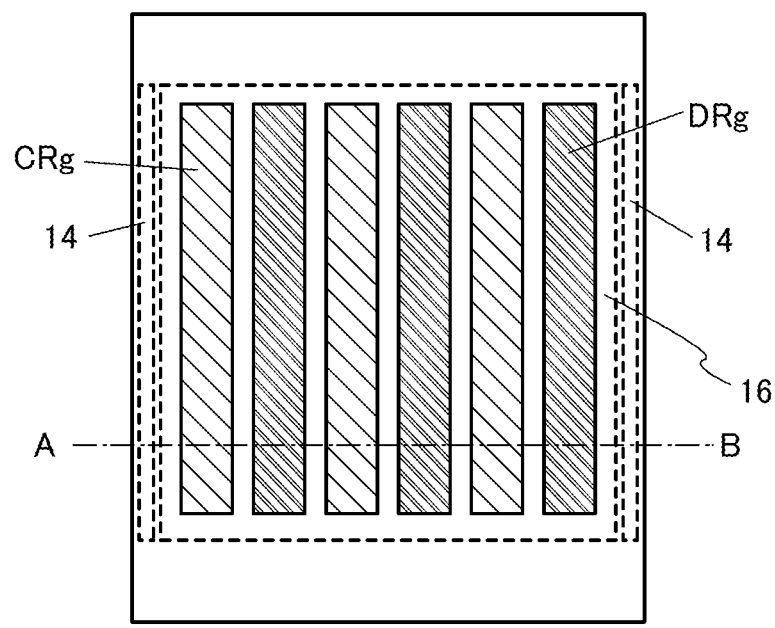
FIGS. 11A and 11B illustrate positions of bend sensor elements.
Figure 11B:
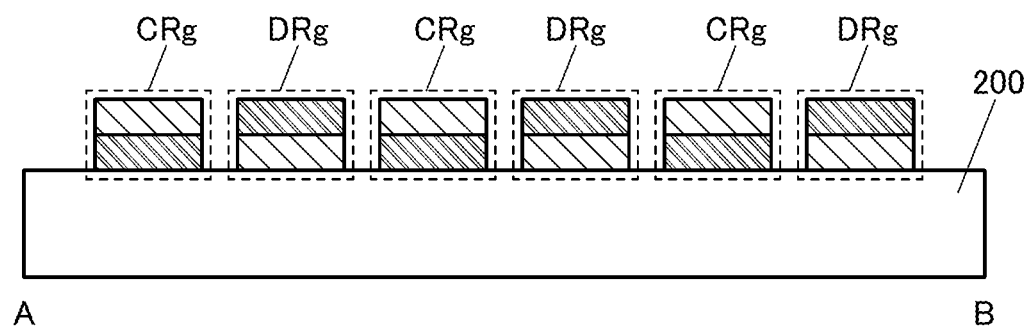

The film 200 is provided with the bend sensor element 190. The bend sensor element 190 includes a conductive layer 191, a conductive layer 192a, a conductive layer 192b, and a conductive layer 193 including a plurality of cracks 194. The conductive layer 191 has higher resistance than the conductive layer 193. The conductive layer 191 is referred to as a high-resistance layer, and the conductive layer 193 is referred to as a low-resistance layer. In the bend sensor element 190, resistance between the conductive layers 192a and 192b is increased when the plurality of cracks 194 are opened. In FIG. 10, when a display region is bent in a concave direction, the plurality of cracks 194 are opened and the resistance of the bend sensor element 190 is increased. That is, the bend sensor element 190 in FIG. 10 corresponds to the bend sensor DRg. In the case where the bend sensor element 190 is positioned in a direction opposite to the direction in FIG. 10, when the display region is bent in a convex direction, the plurality of cracks 194 are opened and the resistance of the bend sensor element 190 is increased. That is, the bend sensor element 190 in that case corresponds to the bend sensor CRg. In this manner, the bend sensor CRg and the bend sensor DRg are positioned in opposite directions (see FIGS. 11A and 11B).

The coloring layer 311, a light-blocking layer 312, an insulating layer 313, a conductive layer 321 functioning as a common electrode of the liquid crystal element 180, an alignment film 182, an insulating layer 314, and the like are provided over the film 300. The insulating layer 314 functions as a spacer for holding the cell gap of the liquid crystal element 180.

Insulating layers such as an insulating layer 211, an insulating layer 212, an insulating layer 213, an insulating layer 214, and an insulating layer 215 are provided on the film 200 side of the insulating layer 220. Part of the insulating layer 211 functions as a gate insulating layer of each transistor. The insulating layer 212, the insulating layer 213, and the insulating layer 214 are provided to cover each transistor. The insulating layer 215 is provided to cover the insulating layer 214. The insulating layers 214 and 215 each function as a planarization layer. Note that an example where the three insulating layers, the insulating layers 212, 213, and 214, are provided to cover the transistors and the like is described here; however, one embodiment of the present invention is not limited to this example, and four or more insulating layers, a single insulating layer, or two insulating layers may be provided. The insulating layer 214 functioning as a planarization layer is not necessarily provided.

The transistor 271, the transistor 272, and the transistor 273 each include a conductive layer 221 part of which functions as a gate, conductive layers 222 parts of which function as a source and a drain, and a semiconductor layer 231. Here, a plurality of layers obtained by processing the same conductive film are shown with the same hatching pattern.

The liquid crystal element 180 is a reflective liquid crystal element. The liquid crystal element 180 has a stacked structure of a conductive layer 322, liquid crystal 183, and the conductive layer 321. A conductive layer 323 that reflects visible light is provided in contact with the conductive layer 322 on the film 200 side. The conductive layer 323 has an opening 330. The conductive layers 321 and 322 transmit visible light. In addition, an alignment film 181 is provided between the liquid crystal 183 and the conductive layer 322, and the alignment film 182 is provided between the liquid crystal 183 and the conductive layer 321. A polarizing plate 301 is provided on an outer surface of the film 300.

In the liquid crystal element 180, the conductive layer 323 has a function of reflecting visible light, and the conductive layer 321 has a function of transmitting visible light. Light entering from the film 300 side is polarized by the polarizing plate 301, passes through the conductive layer 321 and the liquid crystal 183, and is reflected by the conductive layer 323. Then, the light passes through the liquid crystal 183 and the conductive layer 321 again and reaches the polarizing plate 301. At this time, alignment of the liquid crystal is controlled with voltage that is applied between the conductive layer 323 and the conductive layer 321; thus, optical modulation of light can be controlled. That is, the intensity of light emitted through the polarizing plate 301 can be controlled. Light excluding light in a particular wavelength range is absorbed by the coloring layer 311, so that emitted light is red light, for example.

The light-emitting element 170 is a bottom-emission light-emitting element. The light-emitting element 170 has a structure in which a conductive layer 225, an EL layer 173, and a conductive layer 172 are stacked in that order from the insulating layer 220 side. The insulating layer 216 covers an end portion of the conductive layer 225. In addition, a conductive layer 171 is provided to cover the conductive layer 172. The conductive layer 171 contains a material reflecting visible light, and the conductive layers 225 and 172 each contain a material transmitting visible light. Light is emitted from the light-emitting element 170 to the film 300 side through the coloring layer 241, the insulating layer 220, the opening 330, the conductive layer 321, and the like.

Here, as illustrated in FIG. 10, the conductive layer 322 transmitting visible light is preferably provided in the opening 330. Accordingly, the liquid crystal 183 is aligned in a region overlapping with the opening 330 as well as in the other regions. Consequently, an alignment defect of the liquid crystal can be prevented from being generated in the boundary portion of these regions and undesired light leakage can be suppressed.

As the polarizing plate 301 provided on the outer surface of the film 300, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled in accordance with the kind of the polarizing plate so that desired contrast is obtained.

One of a source and a drain of the transistor 272 is electrically connected to the conductive layer 225 of the light-emitting element 170 through a conductive layer 224.

One of a source and a drain of the transistor 273 is electrically connected to the conductive layer 323 through a connection portion 252. The conductive layers 323 and 322 are in contact with and electrically connected to each other. Here, in the connection portion 252, the conductive layers provided on both surfaces of the insulating layer 220 are connected to each other through openings in the insulating layer 220.

A connection portion 251 is provided in a region where the film 200 does not overlap with the film 300. The connection portion 251 is electrically connected to the FPC 350 through a connection layer 260. On the top surface of the connection portion 251, a conductive layer obtained by processing the same conductive film as the conductive layer 322 is exposed. Thus, the connection portion 251 and the FPC 350 can be electrically connected to each other through the connection layer 260.

A connector 303 is provided in part of a region where the adhesive layer 302 is provided. The conductive layer obtained by processing the same conductive film as the conductive layer 322 is electrically connected to part of the conductive layer 321 with the connector 303. Accordingly, a signal or a potential input from the FPC 350 connected to the film 200 side can be supplied to the conductive layer 321 formed on the film 300 side through the connector 303.

As the connector 303, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 303, a material capable of elastic deformation or plastic deformation is preferably used. As illustrated in FIG. 10, the connector 303 which is a conductive particle has a shape that is squeezed vertically in some cases. With the squeezed shape, contact area between the connector 303 and a conductive layer electrically connected to the connector 303 can be increased; thus, contact resistance can be reduced and generation of problems such as disconnection can be suppressed.

The connector 303 is preferably provided to be covered with the adhesive layer 302. For example, the connectors 303 are dispersed in the adhesive layer 302 before the adhesive layer 302 is cured.

An electrode 202 is provided in part of a region where the adhesive layer 201 is provided. A conductive layer obtained by processing the same conductive film as the conductive layer 225 is electrically connected to part of the conductive layer 192b with the electrode 202.

FIG. 10 illustrates an example in which the transistor 271 is provided as the gate driver 14.

The structure in which the semiconductor layer 231 where a channel is formed is provided between two gates is used as an example of the transistors 271 and 272 in FIG. 10. One gate is formed using the conductive layer 221, and the other gate is formed using a conductive layer 223 overlapping with the semiconductor layer 231 with the insulating layer 212 positioned therebetween. Such a structure enables control of threshold voltages of transistors. In that case, the two gates may be connected to each other and supplied with the same signal to operate the transistors. Such transistors can have higher field-effect mobility and thus have higher on-state current than other transistors. Consequently, a circuit capable of high-speed operation can be obtained. Furthermore, area occupied by a circuit portion can be reduced. The use of the transistor having high on-state current can reduce signal delay in wirings and can reduce display unevenness even in a display panel in which the number of wirings is increased because of the increase in size or definition.

The transistors 271, 272, and 273 are preferably OS transistors. Therefore, an oxide semiconductor is preferably used for the semiconductor layer 231. Examples of the oxide semiconductors that can be used for the semiconductor layer 231 include an In—Ga oxide, an In—Zn oxide, and an In-M-Zn oxide (M is Al, Ga, Y, Cu, V, Be, B, Si, Ti, Fe, Ni, Ge, Zr, Mo, La, Ce, Nd, Hf, Ta, W, Mg, or Sn). Note that the oxide semiconductor is not limited to an oxide containing In. The oxide semiconductor may be, for example, a Zn oxide, a Zn—Sn oxide, or a Ga—Sn oxide.

Note that a transistor included in the gate driver 14 and a transistor included in the display pixel 11 may have the same structure. A plurality of transistors included in the gate driver 14 may have the same structure or different structures. A plurality of transistors included in the display pixel 11 may have the same structure or different structures.

A material through which impurities such as water or hydrogen do not easily diffuse is preferably used for at least one of the insulating layers 212 and 213 that cover the transistors. That is, the insulating layer 212 or the insulating layer 213 can function as a barrier film. Such a structure can effectively suppress diffusion of the impurities into the transistors from the outside, and a highly reliable display panel can be provided.

The insulating layer 313 is provided on the film 300 side to cover the coloring layer 311 and the light-blocking layer 312. The insulating layer 313 may function as a planarization layer. The insulating layer 313 enables the conductive layer 321 to have a substantially flat surface, which results in a uniform alignment state of the liquid crystal 183.

An example of a method for manufacturing the display panel 30 is described. For example, the conductive layer 322, the conductive layer 323, and the insulating layer 220 are formed in that order over a support substrate provided with a separation layer, and the transistor 272, the transistor 273, the light-emitting element 170, and the like are formed. Then, the film 200 and the support substrate are bonded to each other with the adhesive layer 201. After that, separation is performed at the interface between the separation layer and each of the insulating layer 220 and the conductive layer 322, so that the support substrate and the separation layer are removed. Separately, the coloring layer 311, the light-blocking layer 312, the conductive layer 321, and the like are formed over the film 300 in advance. Then, the liquid crystal 183 is dropped onto the film 200 or the film 300 and the films 200 and 300 are bonded to each other with the adhesive layer 302, so that the display panel 30 can be manufactured.

A material for the separation layer can be selected as appropriate such that separation at the interface with the insulating layer 220 and the conductive layer 322 occurs. In particular, it is preferable that a stack of a layer including a high-melting-point metal material, such as tungsten, and a layer including an oxide of the metal material be used as the separation layer, and that a stack of a plurality of layers, such as a silicon nitride layer, a silicon oxynitride layer, and a silicon nitride oxide layer be used as the insulating layer 220 over the separation layer. The use of the high-melting-point metal material for the separation layer can increase the formation temperature of a layer formed in a later step, which reduces impurity concentration and achieves a highly reliable display device.

As the conductive layer 322, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 322.

As described above, with the use of the information terminal 10 described in this embodiment, a low-power information terminal can be provided. Alternatively, an information terminal with high visibility can be provided. Alternatively, a novel information terminal can be provided.

Embodiment 3

<Composition of CAC-OS>

The composition of a cloud-aligned composite OS (CAC-OS) that can be used for a transistor disclosed in one embodiment of the present invention is described below.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the one or more metal elements are mixed is referred to as a mosaic pattern or a patch-like pattern.

Note that the oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, tin, or the like may be contained.

As an example of the CAC-OS, an In—Ga—Zn oxide with the CAC composition (such an In—Ga—Zn oxide may be particularly referred to as CAC-IGZO) is described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to the element M in a second region, the first region has higher In concentration than the second region.

Note that a compound containing In, Ga, Zn, and O is also commonly known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC (c-axis-aligned crystalline) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS that contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like, nanoparticle regions including the one or more metal elements as a main component and nanoparticle regions including In as a main component are observed. These nanoparticle regions are randomly dispersed in a mosaic pattern.

The CAC-OS can be formed by sputtering under conditions where a substrate is not heated, for example. In the case where the CAC-OS is formed by sputtering, one or more gases selected from an inert gas (typically, argon), an oxygen gas, and a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region including $GaO_{X3}$ as a main component and the region including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be reduced and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current (I on) and high field-effect mobility (μ) can be achieved.

A semiconductor element including a CAC-OS has high reliability. Thus, the CAC-OS is suited for a variety of semiconductor devices typified by a display.

Unless otherwise specified, on-state current in this specification refers to drain current of a transistor in an on state. Unless otherwise specified, the on state (also sometimes abbreviated to "on") of an n-channel transistor means that voltage $V_G$ between a gate and a source is higher than or equal to the threshold voltage $V_{th}$, and the on state of a p-channel transistor means that $V_G$ is lower than or equal to $V_{th}$. For example, the on-state current of an n-channel transistor refers to drain current that flows when $V_G$ is higher than or equal to $V_{th}$. The on-state current of a transistor depends on voltage $V_D$ between a drain and a source in some cases.

Unless otherwise specified, an off-state current in this specification refers to drain current of a transistor in an off state. Unless otherwise specified, the off state (also sometimes abbreviated to "off") of an n-channel transistor means that $V_G$ is lower than $V_{th}$, and the off state of a p-channel transistor means that $V_G$ is higher than $V_{th}$. For example, the off-state current of an n-channel transistor refers to drain current that flows when $V_G$ is lower than $V_{th}$. The off-state current of a transistor depends on $V_G$ in some cases. Thus, the expression "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification might be off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current might be off-state current at $V_D$ used in a semiconductor device or the like including the transistor.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

This application is based on Japanese Patent Application Serial No. 2016-148050 filed with Japan Patent Office on Jul. 28, 2016, the entire contents of which are hereby incorporated by reference.

What is claimed is:

1. An information terminal comprising a display portion,
wherein the display portion includes a first pixel, a second pixel, a sensor element, a first gate line, a second gate line, and a source line,
wherein the first pixel comprises a first transistor and a liquid crystal element,
wherein the second pixel comprises a second transistor, a third transistor, a capacitor, and a light-emitting element,
wherein a gate of the first transistor is electrically connected to the first gate line, one of a source and a drain of the first transistor is electrically connected to the source line, and the other of the source and the drain of the first transistor is electrically connected to the liquid crystal element,
wherein a gate of the second transistor is electrically connected to the second gate line, one of a source and a drain of the second transistor is electrically connected to the source line, and the other of the source and the drain of the second transistor is electrically connected to a gate of the third transistor,
wherein the gate of the third transistor is electrically connected to the sensor element through the capacitor and one of a source and a drain of the third transistor is electrically connected to the light-emitting element,
wherein the sensor element includes a first bend sensor whose resistance is changed in accordance with bending of the display portion in a convex direction and a second bend sensor whose resistance is changed in accordance with bending of the display portion in a concave direction, and
wherein a luminance of the light-emitting element is controlled in accordance with an output of the sensor element.

2. The information terminal according to claim 1,
wherein the first pixel is not connected to the sensor element.

3. The information terminal according to claim 1, wherein at least one of the first transistor, the second transistor, and the third transistor comprises an oxide semiconductor.

4. The information terminal according to claim 1,
wherein the sensor element further includes a first resistor and a second resistor,
wherein a first terminal of the first resistor is electrically connected to a first terminal of the first bend sensor,
wherein a first terminal of the second resistor is electrically connected to a first terminal of the second bend sensor,
wherein a second terminal of the first resistor is electrically connected to a second terminal of the second bend sensor, and
wherein a second terminal of the second resistor is electrically connected to a second terminal of the first bend sensor.

5. The information terminal according to claim 1,
wherein the liquid crystal element is a reflective liquid crystal element.

6. An information terminal comprising a display portion,
wherein the display portion includes a first pixel, a second pixel, a sensor element, a first gate line, a second gate line, a source line, and a first wiring,
wherein the first pixel comprises a first transistor and a liquid crystal element,
wherein the second pixel comprises a second transistor, a third transistor, a capacitor, and a light-emitting element,
wherein a gate of the first transistor is electrically connected to the first gate line, one of a source and a drain of the first transistor is electrically connected to the source line, and the other of the source and the drain of the first transistor is electrically connected to the liquid crystal element,
wherein a gate of the second transistor is electrically connected to the second gate line, one of a source and a drain of the second transistor is electrically connected to the source line, and the other of the source and the drain of the second transistor is electrically connected to a gate of the third transistor,
wherein the gate of the third transistor is electrically connected to the sensor element through the capacitor and through the first wiring and one of a source and a drain of the third transistor is electrically connected to the light-emitting element,
wherein the sensor element includes a first bend sensor, a second bend sensor, a fourth transistor, and a fifth transistor,
wherein the first bend sensor is electrically connected to the fourth transistor,
wherein the second bend sensor is electrically connected to the fifth transistor,
wherein at least one of the fourth transistor and the fifth transistor is electrically connected to the first wiring, and
wherein a luminance of the light-emitting element is controlled in accordance with an output of the sensor element.

7. The information terminal according to claim 6,
wherein the first pixel is not connected to the sensor element.

8. The information terminal according to claim 6,
wherein resistance of the first bend sensor changes in accordance with bending of the display portion in a convex direction, and
wherein resistance of the second bend sensor changes in accordance with bending of the display portion in a concave direction.

9. The information terminal according to claim 6,
wherein the sensor element further includes a first resistor and a second resistor,
wherein a first terminal of the first resistor is electrically connected to a first terminal of the first bend sensor, wherein a first terminal of the second resistor is electrically connected to a first terminal of the second bend sensor, wherein a second terminal of the first resistor is electrically connected to a second terminal of the second bend sensor, and wherein a second terminal of the second resistor is electrically connected to a second terminal of the first bend sensor.

10. An information terminal comprising a display portion, wherein the display portion includes a first pixel, a second pixel, a sensor element, a first gate line, a second gate line, and a source line, wherein the first pixel comprises a first transistor and a liquid crystal element, wherein the second pixel comprises a second transistor, a third transistor, a capacitor, and a light-emitting element, wherein a gate of the first transistor is electrically connected to the first gate line, one of a source and a drain of the first transistor is electrically connected to the source line, and the other of the source and the drain of the first transistor is electrically connected to the liquid crystal element, wherein a gate of the second transistor is electrically connected to the second gate line, one of a source and a drain of the second transistor is electrically connected to the source line, and the other of the source and the drain of the second transistor is electrically connected to a gate of the third transistor, wherein the gate of the third transistor is electrically connected to the sensor element through the capacitor and one of a source and a drain of the third transistor is electrically connected to the light-emitting element, wherein the sensor element includes a first bend sensor and a second bend sensor, and wherein when an amount of light reflected by the liquid crystal element is changed by bending of the display portion, a luminance of the light-emitting element is controlled in accordance with an output of the sensor element.

11. The information terminal according to claim 10, wherein the first pixel is not connected to the sensor element.

12. The information terminal according to claim 10, wherein resistance of the first bend sensor changes in accordance with bending of the display portion in a convex direction, and wherein resistance of the second bend sensor changes in accordance with bending of the display portion in a concave direction.

13. The information terminal according to claim 10, wherein the sensor element includes a first resistor and a second resistor, wherein a first terminal of the first resistor is electrically connected to a first terminal of the first bend sensor, wherein a first terminal of the second resistor is electrically connected to a first terminal of the second bend sensor, wherein a second terminal of the first resistor is electrically connected to a second terminal of the second bend sensor, and wherein a second terminal of the second resistor is electrically connected to a second terminal of the first bend sensor.

\* \* \* \* \*